US011600490B2

(12) United States Patent
Okada et al.

(10) Patent No.: US 11,600,490 B2
(45) Date of Patent: *Mar. 7, 2023

(54) SILICON FILM FORMING METHOD AND SUBSTRATE PROCESSING APPARATUS

(71) Applicant: TOKYO ELECTRON LIMITED, Tokyo (JP)

(72) Inventors: Mitsuhiro Okada, Nirasaki (JP); Tatsuya Miyahara, Nirasaki (JP); Keisuke Fujita, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 98 days.

This patent is subject to a terminal disclaimer.

(21) Appl. No.: 17/111,867

(22) Filed: Dec. 4, 2020

(65) Prior Publication Data

US 2021/0090887 A1    Mar. 25, 2021

Related U.S. Application Data

(63) Continuation of application No. 16/291,485, filed on Mar. 4, 2019, now Pat. No. 10,892,162.

(30) Foreign Application Priority Data

Mar. 5, 2018    (JP) .............................. JP2018-038719

(51) Int. Cl.
*H01L 21/00*    (2006.01)
*C23C 14/14*    (2006.01)
*H01L 21/02*    (2006.01)
*C23C 14/58*    (2006.01)
(Continued)

(52) U.S. Cl.
CPC ........ *H01L 21/02664* (2013.01); *C23C 14/14* (2013.01); *C23C 14/542* (2013.01); *C23C 14/5873* (2013.01); *H01L 21/0262* (2013.01); *H01L 21/02532* (2013.01); *H01L 21/02592* (2013.01); *H01L 21/02645* (2013.01); *H01L 21/3065* (2013.01)

(58) Field of Classification Search
CPC ....... C23C 16/24; C23C 16/045; C23C 16/56; C23C 14/542; C23C 14/14; C23C 14/5873; H01L 21/3065; H01L 21/02664; H01L 21/02645; H01L 21/02592; H01L 21/02532; H01L 21/0262
See application file for complete search history.

(56) References Cited

U.S. PATENT DOCUMENTS

| 5,733,820 A | 3/1998 | Adachi et al. |
| 7,195,992 B2 | 3/2007 | Gu et al. |
| 8,802,547 B2 | 8/2014 | Kakimoto et al. |

(Continued)

FOREIGN PATENT DOCUMENTS

| JP | 2013-26513 A | 2/2013 |
| JP | 2014-127694 A | 7/2014 |
| KR | 10-2017-0104381 A | 9/2017 |

*Primary Examiner* — Nikolay K Yushin
(74) *Attorney, Agent, or Firm* — Nath, Goldberg & Meyer; Jerald L. Meyer; Tanya E. Harkins (57) ABSTRACT

There is provided a method of forming a silicon film, which includes: a film forming step of forming the silicon film on a base, the silicon film having a film thickness thicker than a desired film thickness; and an etching step of reducing the film thickness of the silicon film by supplying an etching gas containing bromine or iodine to the silicon film.

8 Claims, 12 Drawing Sheets

(51) Int. Cl.
*H01L 21/3065* (2006.01)
*C23C 14/54* (2006.01)

(56) References Cited

U.S. PATENT DOCUMENTS

| | | | |
|---|---|---|---|
| 8,946,065 B2 | | 2/2015 | Okada et al. |
| 9,293,323 B2 | | 3/2016 | Obu et al. |
| 9,758,865 B2 | * | 9/2017 | Hasebe ............. H01L 21/76876 |
| 10,153,153 B2 | | 12/2018 | Kikuchi et al. |
| 2013/0023110 A1 | | 1/2013 | Kakimoto et al. |
| 2013/0109155 A1 | | 5/2013 | Okada et al. |
| 2014/0187024 A1 | | 7/2014 | Obu et al. |
| 2015/0037970 A1 | * | 2/2015 | Hasebe ............. H01L 21/76877 |
| | | | 438/607 |
| 2017/0200602 A1 | | 7/2017 | Kikuchi et al. |

\* cited by examiner

SILICON FILM FORMING METHOD AND SUBSTRATE PROCESSING APPARATUS

CROSS-REFERENCE TO RELATED APPLICATION

This is a Continuation Application of U.S. patent application Ser. No. 16/291,485, filed Mar. 4, 2019, an application claiming the benefit from Japanese Patent Application No. 2018-038719, filed on Mar. 5, 2018, in the Japan Patent Office, the disclosure of each of which is incorporated herein in its entirety by reference.

TECHNICAL FIELD

The present disclosure relates to a silicon film forming method and a substrate processing apparatus.

BACKGROUND

Conventionally, there is known a method of supplying an aminosilane-based gas to a base to form a seed layer and supplying an amino group-free silane-based gas to the seed layer to form a silicon film, thereby reducing the thickness of the silicon film. In addition, there is also known a method of forming an amorphous silicon film on a base and then dry-etching the amorphous silicon film using $Cl_2$ gas to reduce the film thickness of the amorphous silicon film, thereby reducing the thickness of the amorphous silicon film and smoothing the surface of the amorphous silicon film. In this method, it is possible to form a thin silicon film, which has good surface smoothness and has no pinhole.

However, with the methods described above, it is difficult to reduce the thickness of a silicon film to meet the needs of further film thickness reduction.

SUMMARY

Some embodiments of the present disclosure provide a method capable of forming an ultra-thin silicon film, which has good surface smoothness.

According to one embodiment of the present disclosure, there is provided a method of forming a silicon film, the method including: a film forming step of forming the silicon film on a base, the silicon film having a film thickness thicker than a desired film thickness, and an etching step of reducing the film thickness of the silicon film by supplying an etching gas containing bromine or iodine to the silicon film.

According to another embodiment of the present disclosure, there is provided a substrate processing apparatus including: a processing container in which a substrate is accommodated; a gas supply part configured to introduce a film-forming gas and an etching gas into the processing container; and a controller configured to perform a control such that a silicon film having a film thickness thicker than a desired film thickness is formed on the substrate, and the etching gas containing bromine or iodine is supplied onto the silicon film to reduce the film thickness of the silicon film.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, embodiments for carrying out the present disclosure will be described with reference to drawings. In the subject specification and the drawings, components having substantially identical configurations will be designated by like reference numerals with the duplicate descriptions thereof omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Overall Configuration of Substrate Processing Apparatus]

Figure 1:
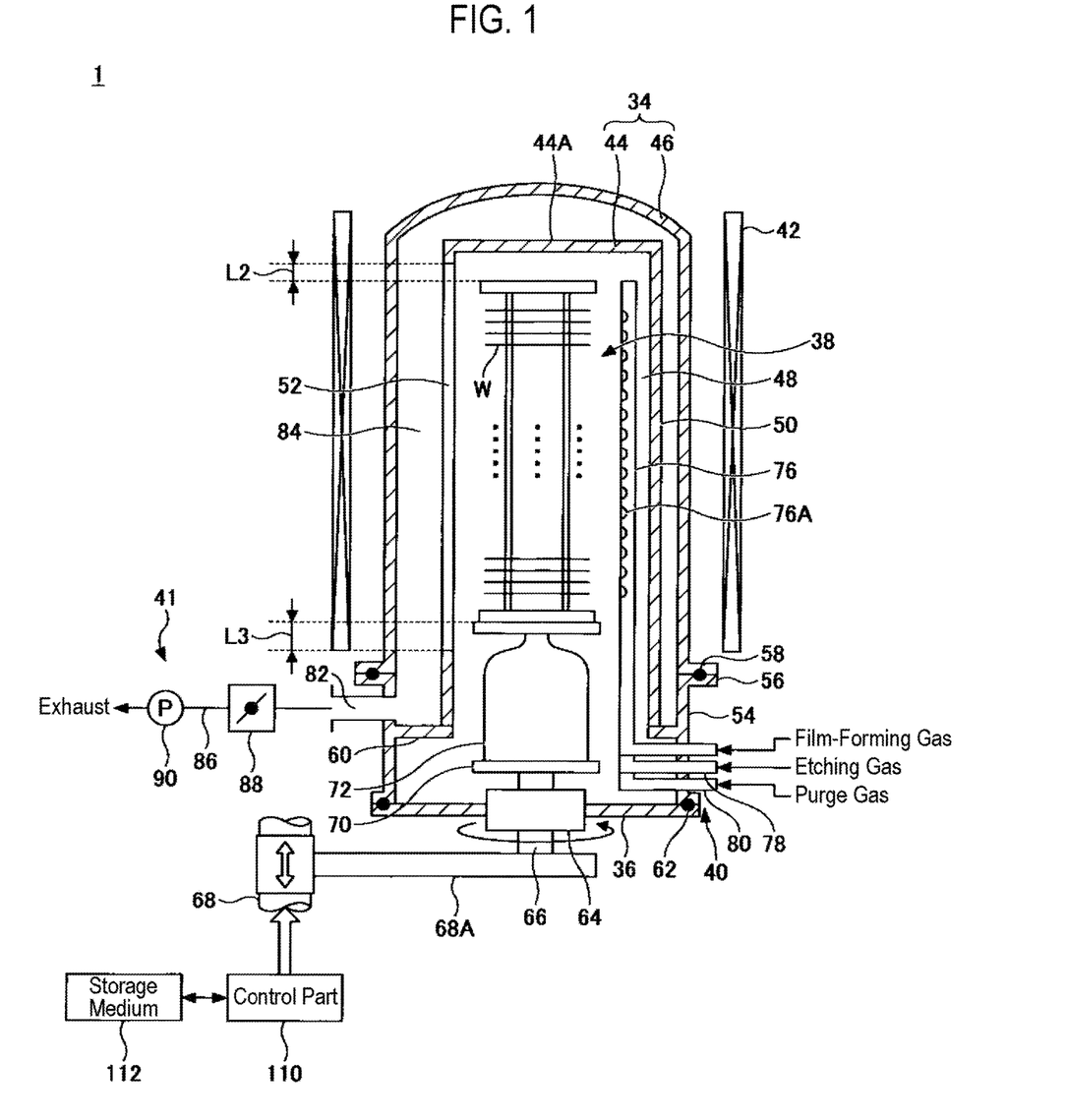
FIG. 1 is a cross-sectional view illustrating an example of a vertical heat treatment apparatus according to an embodiment of the present disclosure.

A substrate processing apparatus capable of carrying out a silicon film forming method according to an embodiment of the present disclosure will be described by taking, as an example, a batch-type vertical heat treatment apparatus. FIG. 1 is a cross-sectional view illustrating an example of a vertical heat treatment apparatus according to an embodiment of the present disclosure.

A substrate processing apparatus 1 includes a processing container 34 configured to accommodate a semiconductor wafer (hereinafter referred to as a "wafer W") as a substrate, a lid part 36 configured to hermetically close an opening defined at a lower end of the processing container 34, a wafer boat 38 as a substrate holder received in the processing container 34 and configured to hold a plurality of wafers W at predetermined intervals, a gas supply part 40 configured to introduce a predetermined gas into the processing container 34, an exhaust part 40 configured to exhaust gas from the processing container 34, and a heating part 42 configured to heat the wafer W.

The processing container 34 includes a cylindrical inner tube 44 having a ceiling and an opened lower end portion, and a cylindrical outer tube 46 having a ceiling and an opened lower end portion. The cylindrical outer tube 46 covers the outer side of the inner tube 44. The inner tube 44 and the outer tube 46 are formed of a heat-resistant material such as quartz, and are arranged in a coaxial relationship with each other to form a double-tube structure.

Figure 2:
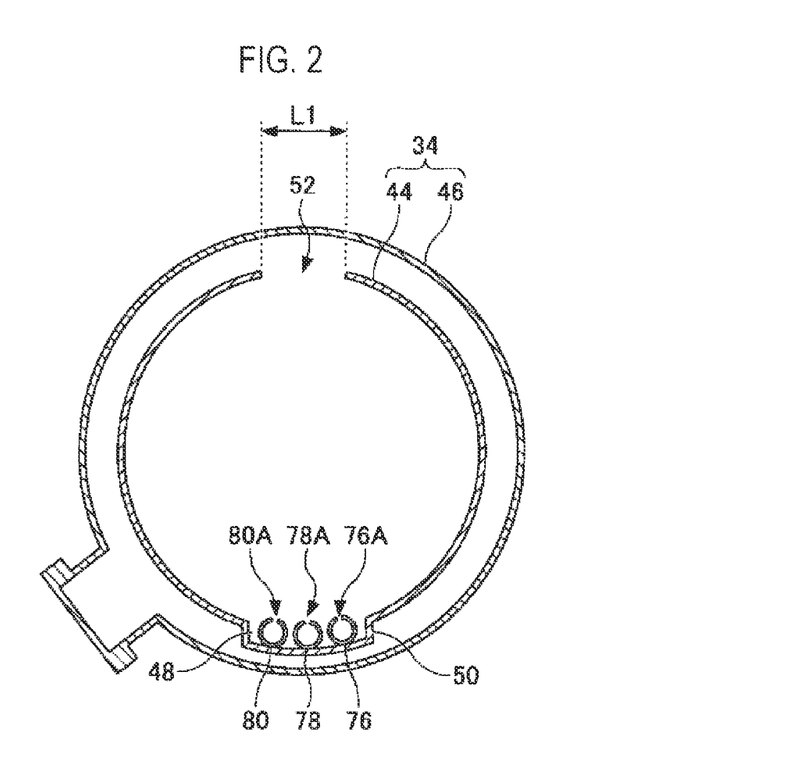
FIG. 2 is a view for explaining a processing container of the vertical heat treatment apparatus of FIG. 1.

A ceiling portion 44A of the inner tube 44 is, for example, flat. A nozzle accommodation portion 48 in which gas nozzles are accommodated is formed at one side of the inner tube 44 along the longitudinal direction (vertical direction). In the embodiment of the present disclosure, as illustrated in FIG. 2, a portion of a sidewall of the inner tube 44 protrudes outward so as to form a convex portion 50. An interior of the convex portion 50 is defined as the nozzle accommodation portion 48.

In addition, in a portion facing the nozzle accommodation portion 48 in the sidewall of the inner tube 44, a rectangular opening 52 having a width L1 is formed in the longitudinal direction (vertical direction).

The opening 52 functions as a gas exhaust port formed exhaust gas from the inner tube 44. In some embodiments, a vertical length of the opening 52 is equal to a vertical of the wafer boat 38. Alternatively, the vertical length of the opening 52 may extend upwards and downwards in the vertical direction to be longer than the vertical length of the wafer boat 38. That is to say, an upper end of the opening 52 extends to a height equal to or higher than a position corresponding to an upper end of the wafer boat 38, and a lower end of the opening 52 extends to a height equal to or less than a position corresponding to a lower end of the wafer boat 38. Specifically, as illustrated in FIG. 1, a distance L2 in the height direction between the upper end of the wafer boat 38 and the upper end of the opening 52 falls within a range of about 0 mm to 5 mm. A distance L3 in the height direction between the lower end of the wafer boat 38 and the lower end of the opening 52 falls within a range of about 0 mm to 350 mm.

The lower end of the processing container 34 is supported by a cylindrical manifold 54 made of, for example, stainless steel. A flange portion 56 is formed on an upper end of the manifold 54. The lower end portion of the outer tube 46 is installed on the flange portion 56 so that the outer tube 46 is supported on the flange portion 56. A seal member 58 such as an O-ring is interposed between the flange portion 56 and the lower end portion of the outer tube 46 to hermetically seal the interior of the outer tube 46.

A circular ring-shaped supporting portion 60 is formed on an upper inner wall of the manifold 54. The lower end portion of the inner tube 44 is installed on the supporting portion 60 so that the inner tube 44 is supported on the supporting portion 60. The lid part 36 is hermetically installed to an opening defined at a lower end of the manifold 54 via a seal member 62 such as an O-ring. Thus, the opening at the lower end of the processing container 34, namely the opening of the manifold 54, is hermetically sealed. The lid part 36 is formed of, for example, stainless steel.

A rotary shaft 66 is provided in the central portion of the lid part 36 so as to penetrate through a magnetic fluid seal part 64. A lower end of the rotary shaft 66 is rotatably supported by an arm 68A of a lift part 68 such as a boat elevator.

A rotary plate 70 is provided on an upper end of the rotary shaft 66. The wafer boat 38 that holds the wafers W is mounted on the rotary plate 70 via a quartz heat-insulating base 72. With this configuration, by moving the lift part 68 up and down, the lid part 36 and the wafer boat 38 move vertically as a unit, so that the wafer boat 38 can be inserted into and removed from the processing container 34.

The gas supply part 40 is provided in the manifold 54 and supplies gases such as a processing gas and a purge gas into the inner tube 44. The gas supply part 40 includes a plurality of (e.g., three) quartz-made gas nozzles 76, 78, and 80. Each of the gas nozzles 76, 78, 80 is installed inside the inner tube 44 in the longitudinal direction. A base end of each of the gas nozzles 76, 78, 80 is bent in an L shape and penetrates through the manifold 54 so that the gas nozzles 76, 78, 80 are supported by the manifold 54.

As illustrated in FIG. 2, the gas nozzles 76, 78, and 80 are installed inside the nozzle accommodation portion 48 of the inner tube 44 in a row along the circumferential direction. A plurality of gas holes 76A, 78A, and 80A are formed in the respective gas nozzles 76, 78, and 80 at predetermined intervals in the longitudinal direction. The respective gases can be ejected horizontally from each of the plurality of gas holes 76A, 78A, and 80A. The predetermined intervals are set, for example, to be equal to intervals of the wafers W supported by the wafer boat 38. A position of each of the gas holes 76A, 78A, and 80A in the height direction is set such that each of the gas holes 76A, 78A, and 80A is located in the middle between two wafers W adjacent to each other in the vertical direction. Thus, each gas can be efficiently supplied to a space defined between the respective two wafers W.

Various kinds of gases such as a film-forming gas, an etching gas, and a purge gas are used as the respective gases. These gases can be supplied through the gas nozzles 76, 78, and 80, respectively, while controlling the flow rates thereof as necessary.

The film-forming gas may be, for example, a silicon-containing gas. For example, aminosilane-based gases such as diisopropylaminosilane (DIPAS), tris(dimethylamino)silane (3DMAS), bis tertiary butylaminosilane (BTBAS) and the like, and amino group-free silane-based gases such as $SiH_4$ (monosilane), $Si_2H_6$ (disilane), dichlorosilane (DCS), hexachlorodisilane (HCD) and the like, may be used as the silicon-containing gas.

The etching gas may be a gas containing bromine or iodine. As the bromine-containing gas, for example, $Br_2$ (bromine) and HBr (hydrogen bromide) may be used. As the iodine-containing gas, for example, $I_2$ (iodine) and HI (hydrogen iodide) may be used.

The purge gas may be an inert gas. As the inert gas, for example, $N_2$ (nitrogen) and Ar (argon) may be used.

A gas outlet 82 is formed in an upper sidewall of the manifold 54 above the supporting portion 60. The gas exhausted from the inner tube 44 through the opening 52 is exhausted from the gas outlet 82 through a space 84 between the inner tube 44 and the outer tube 46. An exhaust part 41 is provided in the gas outlet 82. The exhaust part 41 includes an exhaust passage 86 connected to the gas outlet 82. A pressure regulation valve 88 and a vacuum pump 90 are sequentially provided in the exhaust passage 86, so that the interior of the processing container 34 can be evacuated.

The heating part 42 of a cylindrical shape is provided at the side of an outer periphery of the outer tube 46 so as to cover the outer tube 46. The heating part 42 heats the wafers W accommodated in the processing container 34.

The entire operation of the substrate processing apparatus 1 configured as above is controlled by a control part 110 such as a computer. A computer program that performs the entire operation of the substrate processing apparatus 1 is stored in a storage medium 112. The storage medium 112 may be, for example, a flexible disk, a compact disk, a hard disk, a flash memory, or a DVD.

[Silicon Film Forming Method]

Figure 3:
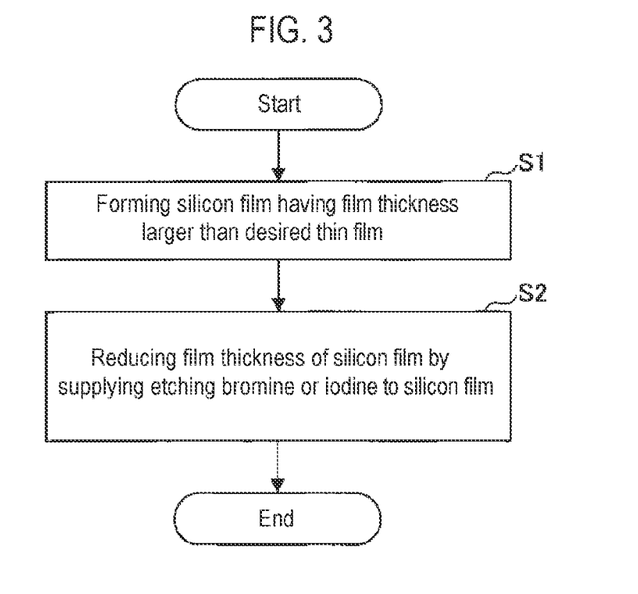
FIG. 3 is a flowchart illustrating an example of a silicon film forming method according to an embodiment of the present disclosure.

A silicon film forming method according to an embodiment of the present disclosure will be described. FIG. 3 is a flowchart illustrating an example of the silicon film forming method according to the embodiment of the present disclosure.

The silicon film forming method according to the embodiment of the present disclosure includes a film forming step S1 of forming a silicon film having a film thickness thicker than a desired film thickness on a base, and an etching step S2 of supplying an etching gas containing bromine or iodine onto the silicon film to reduce the film thickness of the silicon film. In the embodiment of the present disclosure, first, the wafer boat 38 which holds a plurality of wafers W at a predetermined interval is loaded into the processing container 34. Subsequently, the film forming step S1 and the etching step S2 are successively performed inside the processing container 34 as a same processing chamber in a vacuum atmosphere. Thus, the silicon film having a desired film thickness is formed on each wafer W. In some embodiments, a purging step of replacing the gas in the processing container 34 may be performed between the film forming step and the etching step. Subsequently, the wafer boat 38, which holds each wafer W on which the silicon film is formed, is unloaded from the processing container 34. The film forming step S1 and the etching step S2 may be performed in different processing chambers.

The film forming step S1 is a step of forming a silicon film having a film thickness thicker than a desired film thickness by supplying a film-forming gas onto a base. The silicon film formed in the film forming step S1 may be a silicon film having a thick thickness, in which no pinhole is formed. The film thickness of the silicon film may be selected depending on film-forming conditions of the silicon film. For example, in a film-forming condition in which pinholes are formed in a silicon film when the film thickness is 25 Å or less, in the film forming step S1, a silicon film having a film thickness thicker than 25 Å may be formed on a base. As an example, a silicon film having a film thickness of 30 Å, which is thicker by 5 Å, may be formed on the base. That is to say, a silicon film having a film thickness larger than a pinhole limit by 5 Å or more may be formed.

The film forming step S1 may include, for example, a seed layer forming step of forming a seed layer on the surface of the base by supplying an aminosilane-based gas to the base, and a silicon film forming step of forming a silicon film on the seed layer by supplying an amino group-free silane-based gas onto the seed layer. In some embodiments, another silicon film forming step of supplying a higher-order silane-based gas than the silane-based gas used in the silicon film forming step onto the seed layer may be included between the seed layer forming step and the silicon film forming step. In some embodiments, a purging step of replacing the gas in the processing container 34 may be included between the respective steps.

The etching step S2 is a step of supplying an etching gas containing bromine or iodine onto a silicon film to reduce a film thickness of the silicon film, thus adjusting the film thickness of the silicon film to a desired film thickness. At this time, the etching of the silicon film using the etching gas containing bromine or iodine becomes conformal etching without deteriorating the surface roughness of the silicon film. Thus, even if the silicon film has a concave-convex pattern having a large surface area, the silicon film may be etched with enhanced controllability. From the viewpoint of productivity, it is desirable to perform the etching step S2 at a temperature higher than that in the film forming step S1.

The purging step is a step of replacing the gas in the processing container 34. In the purging step, a purge gas is introduced into the processing container 34 from the gas nozzle 80 so that the film-forming gas and the etching gas remaining in the processing container 34 are replaced with the purge gas.

As described above, the silicon film forming method according to the embodiment of the present disclosure includes forming the silicon film having a film thickness thicker than a desired film thickness on the base. This makes it possible to obtain a silicon film having fewer pinholes than those in the silicon film having a desired film thickness. Subsequently, the etching gas containing bromine or iodine is supplied onto the silicon film to reduce the film thickness of the silicon film. Thus, the film thickness of the silicon film is adjusted to a desired film thickness. It is therefore possible to perform conformal etching without deteriorating the surface roughness of the silicon film. Even if the silicon film has a concave-convex pattern having a large surface, it is possible to etch the silicon film with enhanced controllability. As a result, it is possible to form an ultra-thin silicon film which has good surface smoothness.

Example 1

Example 1, from which the action and effect of the silicon film forming method according to the embodiment of the present disclosure was confirmed, will be described.

<Sample>

A sample fabricated in Example 1 will be described.

(Samples 1A to 1F)

A silicon film having a thickness of 50 Å was formed on each of the silicon substrates on each of which an oxide film is formed (in the film forming step S1). Subsequently, the silicon film was etched-back (in the etching step S2). As a result, silicon films having film thicknesses of 19 Å, 20 Å, 21 Å, 23 Å, 25 Å, and 26 Å were formed. The silicon substrates and the oxide films are examples of the base. The silicon film is an example of a film to be evaluated for the presence or absence of pinholes. The silicon substrates having the silicon films having film thicknesses of 19 Å, 20 Å, 21 Å, 23 Å, 25 Å, and 26 Å formed thereon are referred to as Samples 1A, 1B, 1C, 1D, 1E, and 1F, respectively. Process conditions used in the film forming step S1 and the etching step S2 are as follows.

<Film forming Step S1 (seed layer forming step)>
Substrate temperature: 380 degrees C.
Internal pressure of processing container 34: 1.0 Torr (133.3 Pa)
Gas: DIPAS
<Film forming Step S1 (silicon film forming step)>
Substrate temperature: 470 degrees C.
Internal pressure of processing container 34: 3.0 Torr (399.9 Pa)
GAS: DCS/SiH$_4$
<Etching Step S2>
Substrate temperature: 550 degrees C.
Internal pressure of processing container 34: 20 to 80 Torr (2,666 to 10,666 Pa)
Gas: HBr (Samples 2A to 2G)

Silicon films having film thicknesses of 25 Å, 27.7 Å, 33.7 Å, 34.8 Å, 39.5 Å, 42.8 Å, and 54.7 Å were formed on silicon substrates each having an oxide film formed thereon, respectively. The silicon substrates having the silicon films having film thicknesses of 25 Å, 27.7 Å, 33.7 Å, 34.8 Å, 39.5 Å, 42.8 Å, and 54.7 Å formed thereon are referred to as Samples 2A, 2B, 2C, 2D, 2E, 2F, and 2G, respectively. Process conditions used in the film forming step S1 were the same as those used in the samples 1A to 1F1.

(Sample 3A)

Sample 3A was obtained by forming a silicon film having a film thickness of 50 Å on a silicon substrate having an oxide film formed thereon (in the film forming step S1), and etching back the silicon film to have a film thickness of 15 Å (in the etching step S2). Process conditions used in the film forming step S1 and the etching step S2 were as follows.

<Film Forming Step S1 (seed layer forming step)>
Substrate temperature: 380 degrees C.
Internal pressure of processing container 34: 1.0 Torr (133.3 Pa)
Gas: DIPAS
<Film Forming Step S1 (another silicon film forming step)>
Substrate temperature: 380 degrees C.
Internal pressure of processing container 34: 1.0 Torr (133.3 Pa)
Gas: $Si_2H_6$
<Film Forming Step S1 (silicon film firming step)>
Substrate temperature: 470 degrees C.
Internal pressure of processing container 34: 3.0 Torr (399.9 Pa)
GAS: $DCS/SiH_4$
<Etching Step S2>
Substrate temperature: 550 degrees C.
Internal pressure of processing container 34: 20 to 80 Torr (2,666 to 10,666 Pa)
Gas: HBr (Sample 4A)

Sample 4A was obtained by forming a silicon film having a film thickness of 15 Å on a silicon substrate having an oxide film formed thereon. Process conditions used in the film forming step S1 were the same as those used in Sample 3A.

<Evaluation Method>

Figure 4A:
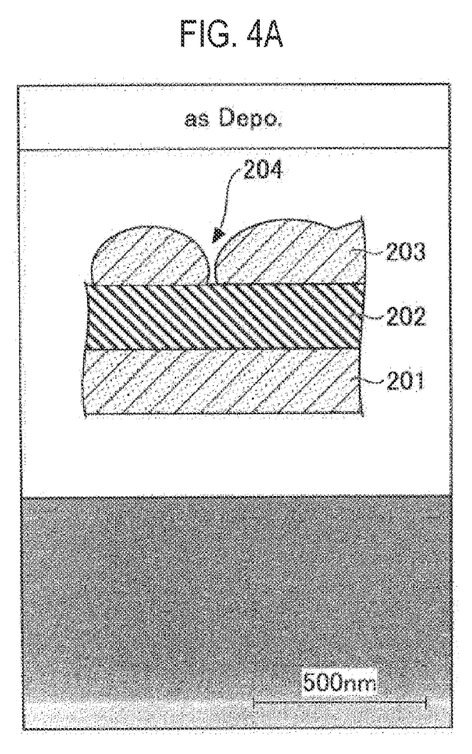
FIGS. 4A to 4C are views for explaining a method of evaluating the presence or absence of pinholes.
Figure 4B:
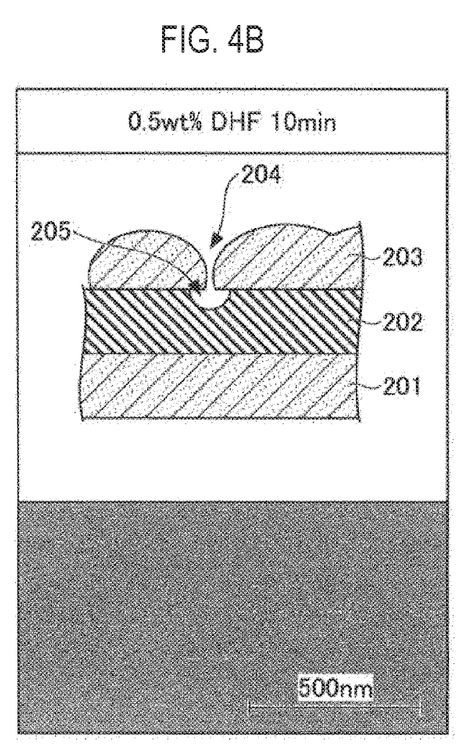
Figure 4C:
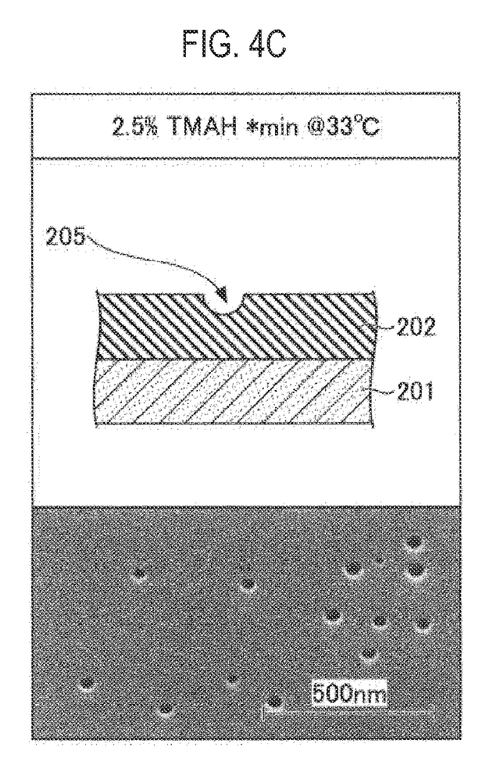

A method of evaluating the presence or absence of pinholes on the surface of the silicon film will be described. FIGS. 4A to 4C are views for explaining the method of evaluating the presence or absence of pinholes. FIG. 4A shows a schematic cross section of a sample in which an oxide film and a silicon film are formed on a silicon substrate, and a surface image obtained by a Scanning Electron Microscope (SEM). FIG. 4B shows a schematic cross section of a sample obtained by immersing the sample of FIG. 4A in diluted hydrofluoric acid (DHF) of 0.5 wt % for 10 minutes and a surface image obtained by SEM. FIG. 4C shows a schematic cross section of a sample obtained by immersing the sample of FIG. 4B in tetramethylammonium hydroxide (TMAH) of 2.5% whose temperature was adjusted to 33 degrees C. and a surface image obtained by SEM.

First, as illustrated in FIG. 4A, Samples 1A to 1F, Samples 2A to 2G, Sample 3A, and Sample 4A, in each of which an oxide film 202 and a silicon film 203 is formed on a silicon substrate 201, are prepared. At this time, as illustrated in FIG. 4A, even if a pinhole 204 is generated in the silicon film 203, since the size of the pinhole 204 is quite small, it is difficult to evaluate the presence or absence of the pinhole 204 using the surface image obtained by SEM.

Subsequently, as illustrated in FIG. 4B, the silicon substrate 201 is immersed in DHF of 0.5 wt % for 10 minutes. The DHF hardly etches the silicon film but has the property of etching the oxide film. Thus, the silicon film 203 functions as an etching mask. A portion of the oxide film 202 is etched through the pinhole 204 formed in the silicon film 203. As a result, a recess 205 having a larger diameter than that of the pinhole 204 generated in the silicon film 203 in plan view is formed in the surface of the oxide film 202.

Subsequently, as shown in FIG. 4C, the silicon substrate 201 was immersed in TMAH of 2.5% whose temperature is adjusted to 33 degrees C. The TMAH has a high selectivity of silica film to oxide film. Thus, the silicon film 203 is etched away and the oxide film 202 remains. As a result, the oxide film 202, which has the recess 205 formed at a position corresponding to the pinhole 204 formed in the silicon film 203, is exposed on the surface.

Thereafter, the surface of the sample of FIG. 4C is observed with SEM to obtain a SEM-based surface image. In addition, pinholes on the SEM-based surface image are detected by an image analysis software to measure the number of pinholes, Various software may be used as the image analysis software. This makes it possible to clearly confirm the presence or absence of pinholes and the number of pinholes.

[Evaluation Result 1]

Figure 5:
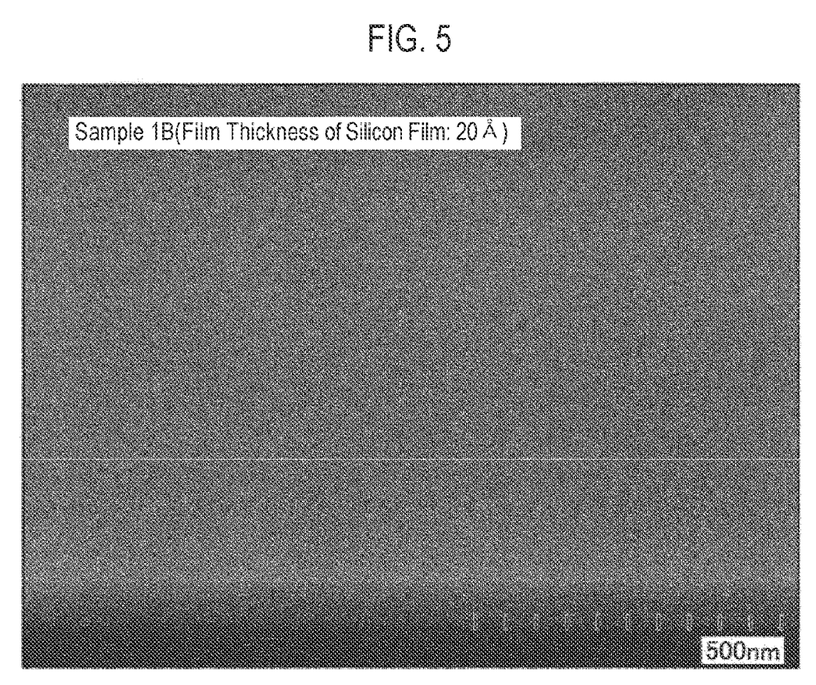
FIG. 5 is a view showing an SEM image on a surface of a silicon film.
Figure 6:
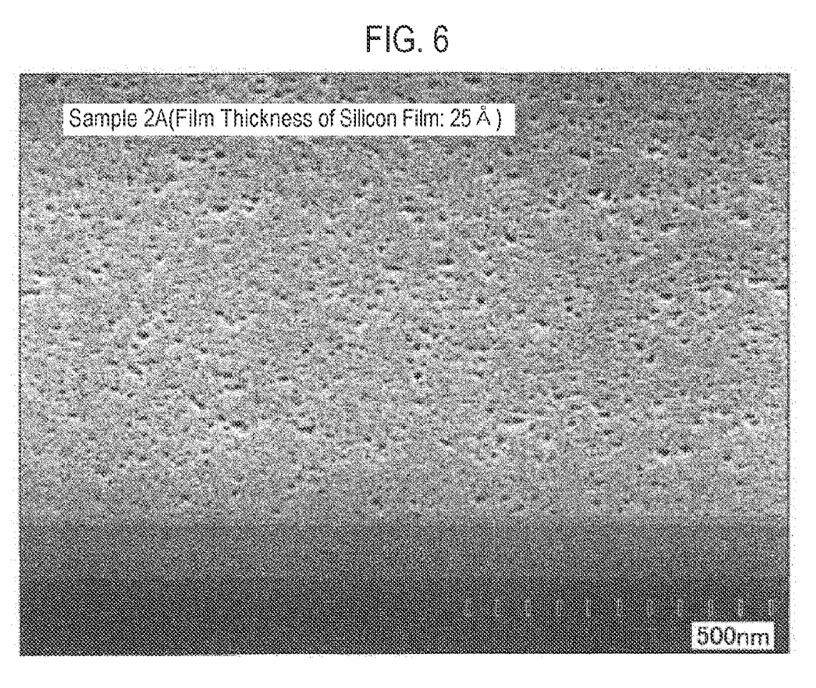
FIG. 6 is a view showing an SEM image on the surface of the silicon film.

For each of Sample 1B and Sample 2A, the presence or absence of pinholes on the surface of the silicon film was evaluated by the aforementioned evaluation method. FIGS. 5 and 6 are views showing SEM-based surface images of oxide films in Sample 1B and Sample 2A, respectively.

Pinholes were not generated in Sample 1B (see FIG. 5), whereas a large number of pinholes were generated in Sample 2A (see FIG. 6). From these results, it is considered that by performing the etching step S2 after the film forming step S1, it is possible to prevent the generation of pinholes on the surface of the silicon film and to form an ultra-thin silicon film having good surface smoothness.

[Evaluation Result 2]

Figure 7:
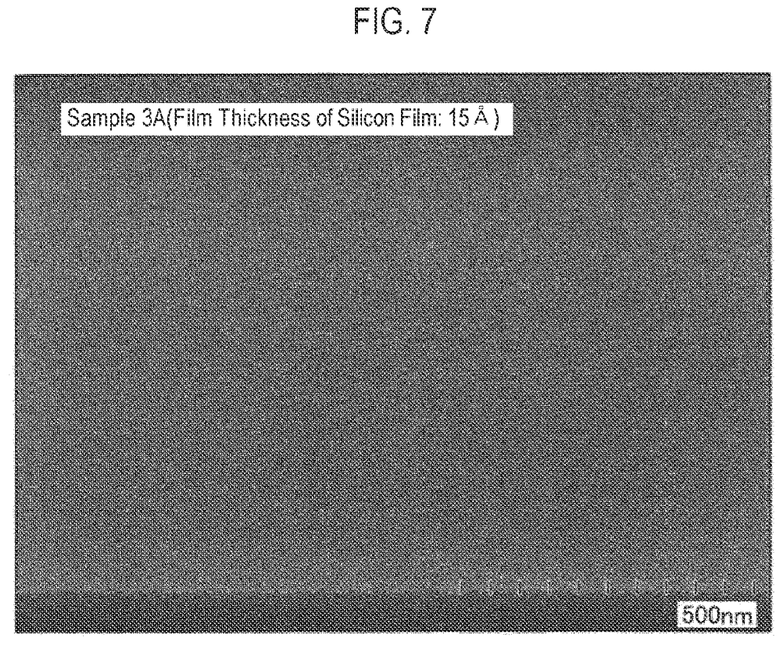
FIG. 7 is a view showing an SEM image on the surface of the silicon film.
Figure 8:
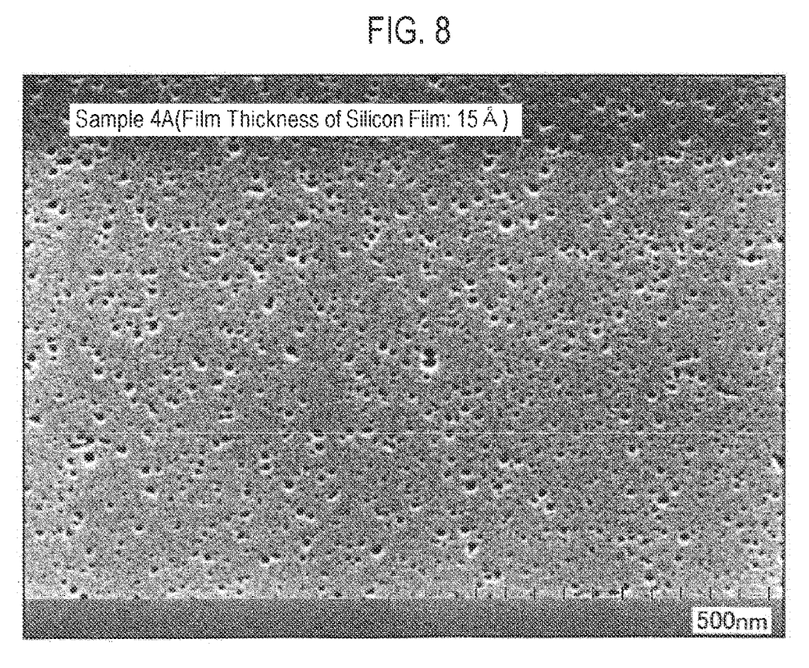
FIG. 8 is a view showing an SEM image on the surface of the silicon film.

For each of Sample 3A and Sample 4A, the presence or absence of pinholes on the surface of the silicon film was evaluated by the aforementioned evaluation method. FIGS. 7 and 8 are views showing SEM-based surface images of oxide films in Sample 3A and Sample 4A, respectively.

Pinholes were not generated in Sample 3A (see FIG. 7), whereas a large number of pinholes were generated in Sample 4A (see FIG. 8). From these results, it is considered that by performing the etching step S2 after the film forming step S1, it is possible to prevent the generation of pinholes on the surface of the silicon film and to form a ultra-thin silicon film having the good surface smoothness.

[Evaluation Result 3]

Figure 9:
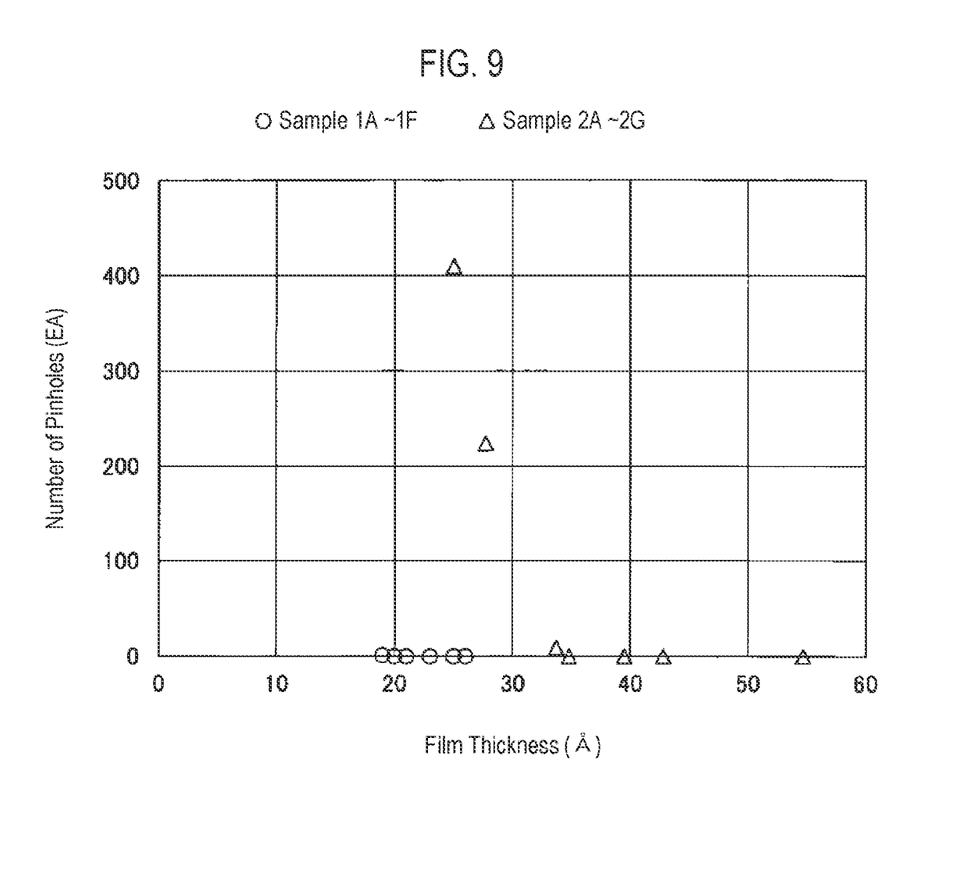
FIG. 9 is a diagram representing the relationship between a film thickness of the silicon film and the number of pinholes.

For each of Samples 1A to 1F and Samples 2A to 2G, the number of pinholes on the surface of the silicon film was evaluated by the aforementioned evaluation method. FIG. 9 is a diagram representing the relationship between a film thickness of the silicon film and the number of pinholes in the silicon film. In FIG. 9, the horizontal axis represents the film thickness (Å) of the silicon film, and the vertical axis represents the number of pinholes (EA) on the surface of the silicon film (an observation area: about 1.2 μm×0.9 μm). In addition, in FIG. 9, circles indicate Samples 1A to 1F, and triangles indicate Samples 2A to 2G.

In Samples 1A to 1F indicated by the circles in FIG. 9, in the case of the film thickness of 19 Å, one pinhole was generated. In the case of the film thicknesses of 20 Å, 21 Å, 23 Å, 25 Å, and 26 Å, no pinhole was generated. Meanwhile, in Samples 2A to 2G indicated by the triangles in FIG. 9, in the case of the film thicknesses of 34.8 Å, 39.5 Å, 42.8 Å, and 54.7 Å, no pinhole was generated. In the case of the film thicknesses of 25 Å, 27.7 Å, and 33.7 Å, 410 pinholes, 224 pinholes, and 9 pinholes were generated, respectively. From these results, it is considered that by performing the etching step S2 after the film forming step S1, it is possible to prevent the generation of pinholes on the surface of the silicon film and to form an ultra-thin silicon film having good surface smoothness.

Example 2

In Example 2, a cross-section shape and surface shape of a silicon film obtained when using HBr, which is an example of the etching gas, were evaluated using SEM and an Atomic Force Microscope (AFM). For comparison, a cross-sectional shape and surface shape of a silicon film obtained using chlorine ($Cl_2$) as an etching gas were also evaluated in the same manner.

First, a silicon oxide film was firmed in conformity to a concave-convex shape of a silicon substrate having a line-and-space (L&S) pattern formed thereon. Subsequently, a first seed layer was formed by supplying DIPAS as an aminosilane-based gas onto the silicon oxide film. A second seed layer was formed by supplying $Si_2H_6$ onto the first seed layer. Subsequently, an amorphous silicon (a-Si) film was formed in conformity to the L&S pattern by supplying $SiH_4$ onto the second seed layer. Subsequently, the film thickness of the a-Si film was reduced by supplying $Cl_2$ or HBr as an etching gas onto the a-Si film. The total thickness of the first seed layer, the second seed layer, and the a-Si film was about 25 nm. In the etching using $Cl_2$, the internal pressure of the processing container 34 was set to 3.0 Torr (399.9 Pa) and the substrate temperature was set to 325 degrees C. In the etching using HBr, the internal pressure of the processing container 34 was set to 20 Torr (2,666 Pa) and the substrate temperature was set to 550 degrees C.

Next, the cross-sectional shapes of the prepared samples were evaluated using SEM.

Figure 10A:
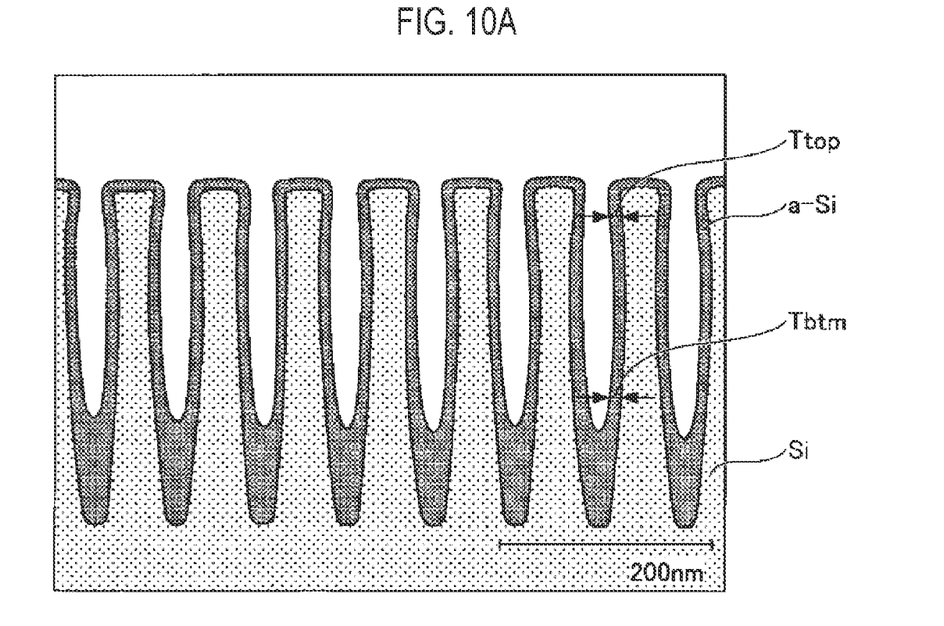
FIGS. 10A and 10B are views illustrating a sectional shape of a line-and-space pattern, respectively.
Figure 10B:
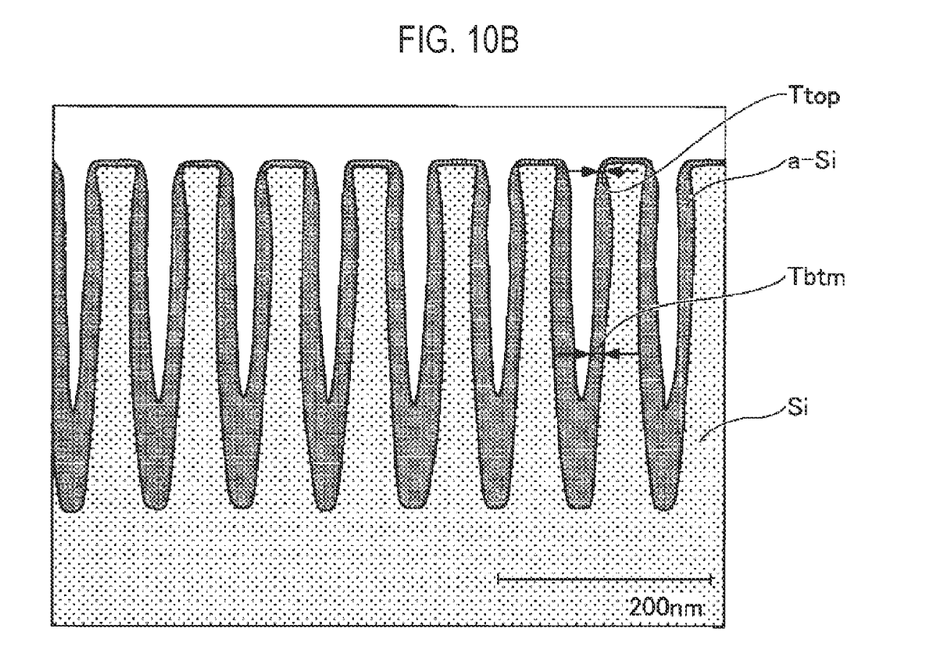

FIGS. 10A and 10B illustrate cross-sectional shapes of the L&S pattern. FIG. 10A illustrates the cross-sectional shape of a sample obtained by etching an a-Si film using HBr, and FIG. 10B illustrates the cross-sectional shape of a sample obtained by etching the a-Si film using $Cl_2$. Since the silicon oxide film formed between the silicon substrate and the a-Si film is extremely thin relative to the a-Si film, it was impossible to confirm the silicon oxide film in FIGS. 10A and 10B.

As illustrated in FIG. 10A, it can be seen that, when the a-Si film was etched using HBr, the a-Si film formed in conformity to the L&S pattern of the silicon substrate was etched in a conformal manner, in other words, it can be seen that a film thickness Ttop of an a-Si film remaining on an upper sidewall of each line in the L&S pattern and a film thickness Tbtm of the a-Si film remaining on a lower sidewall of each line in the L&S pattern are substantially equal to each other, and thus the sectional shape of each space in the L&S pattern is substantially a U-formation.

Meanwhile, as illustrated in FIG. 10B, it can be seen that, when the a-Si film was etched using $Cl_2$, the a-Si film formed in conformity to the L&S pattern of the silicon substrate was more etched on the upper sidewall of each line of the L&S pattern than on the lower sidewall of each line in the L&S pattern. In other words, it can be seen that the film thickness Ttop of the a-Si film remaining on the upper sidewall of each line in the L&S pattern becomes smaller than the film thickness Tbtm of the a-Si film remaining on the lower sidewall of each line in the L&S pattern, and thus the sectional shape of each space in the L&S pattern are substantially a V-formation.

From the foregoing, it can be said that by etching the a-Si film using HBr, it is possible to etch the a-Si film formed in conformity to the concave-convex shape in a conformal manner.

Subsequently, the surface shapes of the prepared samples were evaluated using AFM.

As a result of the AFM-based evaluation, a surface roughness Ra of each line in the L&S pattern before etching the a-Si film was 0.289. In addition, when the a-Si film was etched using HBr, the surface roughness Ra of each line in the L&S pattern was 0.244. Thus, a surface smoother than that before etching the a-Si film was obtained. Meanwhile, when the a-Si film was etched using $Cl_2$, the surface roughness Ra of each line in the L&S pattern was 0.342, which becomes larger than that before etching the a-Si film.

From the foregoing, it can be said that, by etching the a-Si film using HBr, it is possible to form an a-Si film having good surface smoothness, Example 3

In Example 3, a dependence of an etching rate of HBr used as an example of etching gas on temperature in an a-Si film was evaluated. For comparison, the dependence of the etching rate on temperature when the a-Si film was etched using $Cl_2$ was also evaluated.

Figure 11:
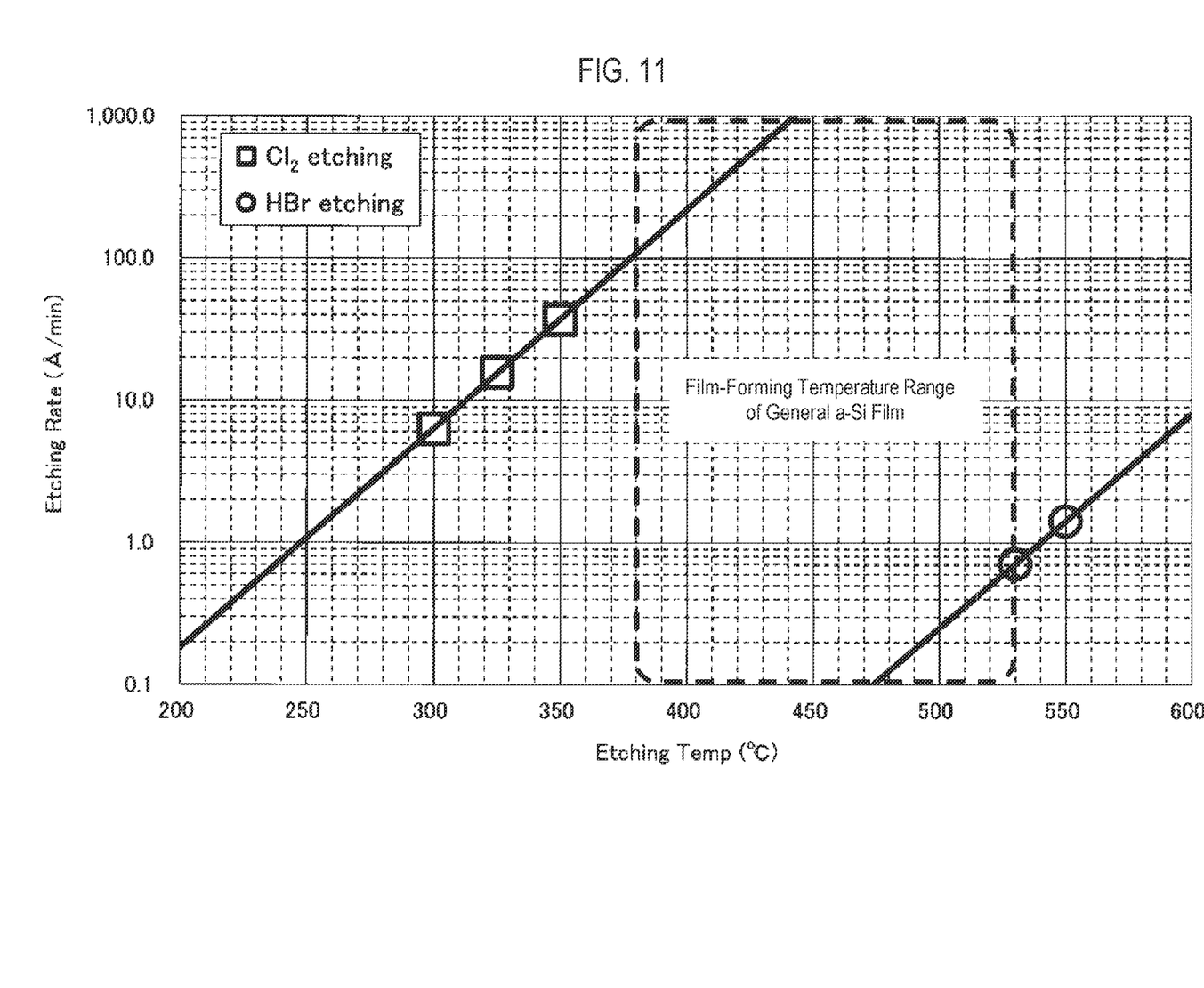
FIG. 11 is a diagram representing a dependence of an etching rate of an etching gas on temperature in an a-Si film.

FIG. 11 is a diagram representing a dependence of an etching rate of an etching gas on temperature in an a-Si film. In FIG. 11, the horizontal axis represents the etching temperature (degree C.), and the vertical axis represents the etching rate (Å/min). In addition, in FIG. 11, the film-forming temperature range of a general a-Si film is represented as a range enclosed by a broken line.

As represented in FIG. 11, in the case of using HBr as an etching gas, it is possible to etch the a-Si film at a temperature substantially equal to or slightly higher than the film-forming temperature of the a-Si film after forming the a-Si film at a generally-used temperature (e.g., 380 degrees C. to 530 degrees C.). Therefore, it takes little time in stabilizing the temperature before etching the a-Si film.

Meanwhile, in the case of using $Cl_2$ as an etching gas, when etching is performed after forming the a-Si film at the generally-used temperature, it is necessary to lower the temperature to a temperature at which the film thickness of the a-Si film is capable of being controlled (e.g., 350 degrees C. or less) after the formation of the a-Si film. Therefore, the time required for stabilizing the temperature before etching the a-Si film is prolonged.

From the foregoing, in the case of etching the a-Si film, by using HBr as the etching gas, it is possible to shorten the time required for stabilizing the temperature before etching the a-Si film and to improve the productivity.

Although some embodiments for carrying out the present disclosure have been described above, the above contents do not limit the contents of the present disclosure, and various modifications and improvements are possible within the scope of the present disclosure.

According to the present disclosure in some embodiments, it is possible to form an ultra-thin silicon film having good surface smoothness.

In the embodiments described above, a batch-type vertical heat treatment apparatus, which performs processing on a plurality of wafers at a time, has been described as an example of a substrate processing apparatus, but the present disclosure is not limited thereto. For example, the substrate processing apparatus may be a single wafer type apparatus, which processes wafers one by one. In some embodiments, for example, the substrate processing apparatus may be a semi-batch type apparatus, which revolves a plurality of wafers arranged on a rotary table inside a processing container by the rotary table and causes the wafers to sequentially pass through a region to which a source gas is supplied and a region to which a reaction gas reacting with the source gas is supplied, thus forming a film on the surface of each wafer.

What is claimed is:

1. A method of forming a silicon film, the method comprising:
    a film forming step of forming the silicon film on a base; and
    an etching step of reducing a film thickness of the silicon film by supplying an etching gas containing bromine or iodine to the silicon film,
    wherein concave-convex portions are formed in a surface of the base,
    wherein the etching step includes etching the silicon film formed on the concave-convex portions of the base in a conformal manner,
    wherein the etching step is performed at a temperature higher than a temperature in the film forming step,
    wherein the film forming step and the etching step are successively performed in a same processing chamber, and
    wherein the temperature in the film formation step is equal to or higher than 380 degrees C.

2. The method of claim 1, wherein the film thickness of the silicon film is a film thickness at which no pinhole is generated.

3. The method of claim 1, wherein the film forming step includes forming the silicon film on the concave-convex portions of the base in a conformal manner.

4. The method of claim 1, wherein the etching gas is at least one selected from a group consisting of a $Br_2$ gas, an HBr gas, an $I_2$ gas, and an HI gas.

5. The method of claim 1, wherein a surface roughness of the silicon film decreases in the etching step.

6. The method of claim 1, wherein the film forming step includes:
    a seed layer forming step of forming a seed layer on the surface of the base by supplying an aminosilane-based gas onto the base; and
    a first silicon film forming step of forming another silicon film on the seed layer by supplying an amino group-free silane-based gas onto the seed layer.

7. The method of claim 6, further comprising:
    a second silicon film forming step of supplying a higher-order silane-based gas than the amino group-free silane-based gas used in the first silicon film forming step to the seed layer between the seed layer forming step and the first silicon film forming step.

8. A substrate processing apparatus comprising:
    a processing container in which a substrate is accommodated;
    a gas supply part configured to introduce a film-forming gas and an etching gas into the processing container; and
    a controller configured to perform a control such that a silicon film is formed on the substrate, and the etching gas containing bromine or iodine is supplied onto the silicon film to reduce the film thickness of the silicon film,
    wherein concave-convex portions are formed in a surface of the substrate,
    wherein the silicon film formed on the concave-convex portions of the substrate is etched in a conformal manner,
    wherein a temperature when etching the silicon film is higher than a temperature when forming the silicon film,
    wherein the forming the silicon film and the etching the silicon film are successively performed in a same processing chamber, and
    wherein the temperature when forming the silicon film is equal to or higher than 380 degrees C.

* * * * *